(12) United States Patent
Tetelbaum et al.

(10) Patent No.: US 8,332,792 B2
(45) Date of Patent: Dec. 11, 2012

(54) IMPLEMENTING AND CHECKING ELECTRONIC CIRCUITS WITH FLEXIBLE RAMPTIME LIMITS AND TOOLS FOR PERFORMING THE SAME

(75) Inventors: Alexander Tetelbaum, Hayward, CA (US); Joseph Jamann, Nazareth, PA (US); Rich Laubhan, Windsor, CO (US); Bruce Zahn, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 187 days.

(21) Appl. No.: 12/836,274

(22) Filed: Jul. 14, 2010

(65) Prior Publication Data

US 2012/0017190 A1 Jan. 19, 2012

(51) Int. Cl.
*G06F 17/50* (2006.01)

(52) U.S. Cl. .......... 716/113; 716/108; 716/114

(58) Field of Classification Search .......... 716/108, 716/113, 114
See application file for complete search history.

(56) References Cited

U.S. PATENT DOCUMENTS

| | | | |
|---|---|---|---|
| 7,096,442 B2 * | 8/2006 | Lu et al. | 716/113 |
| 7,178,121 B2 * | 2/2007 | Tetelbaum | 716/113 |
| 7,207,021 B2 | 4/2007 | Cui et al. | |
| 7,225,418 B2 * | 5/2007 | Shimazaki et al. | 716/113 |
| 7,299,435 B2 * | 11/2007 | Cui et al. | 716/108 |
| 2001/0029600 A1 * | 10/2001 | Lee et al. | 716/17 |
| 2002/0021135 A1 * | 2/2002 | Li et al. | 324/677 |
| 2003/0233622 A1 * | 12/2003 | Nystrom et al. | 716/1 |

* cited by examiner

*Primary Examiner* — Naum Levin

(57) ABSTRACT

An apparatus and a method of generating a flexible ramptime limit for an electronic circuit, a computer program product that performs the same method, and a method of manufacturing an electronic circuit employing a flexible ramptime limit is disclosed. In one embodiment, the method for generating a flexible ramptime limit includes: (1) calculating a frequency based ramptime limit for the electronic circuit, (2) obtaining a library based ramptime limit for the electronic circuit, (3) determining a minimum ramptime limit between the frequency based ramptime limit and the library based ramptime limit and (4) selecting the minimum ramptime limit as the flexible ramptime limit.

16 Claims, 3 Drawing Sheets

IMPLEMENTING AND CHECKING ELECTRONIC CIRCUITS WITH FLEXIBLE RAMPTIME LIMITS AND TOOLS FOR PERFORMING THE SAME

TECHNICAL FIELD

This application is directed, in general, to electronic circuits and, more specifically, to the ramptime of data signals and clock signals in electronic circuits.

BACKGROUND

The design and manufacturing of electronic circuits, such as integrated circuits, includes synthesizing a logical representation of a circuit design into a physical implementation. Typically referred to as the implementation stage, physical synthesis includes placement and routing stages. During the placement stage, gates from a netlist of the circuit design are assigned to locations on a die area. In the routing stage, the wires that connect the various gates from the netlist are added. For the placement and routing stages, Electronic Design Automation (EDA) tools are typically used. EDA tools, a category of computer aided design (CAD) tools, are used by electronic circuit designers to create representations of circuit configurations, including representations of cells (e.g., transistors) and the interconnects (i.e., the data nets) that couple them together.

During the physical implementation, ramptime of data signals and clock signals in an electronic circuit is limited to meet signal integrity requirements and then checked during timing signoff. If a signal does not reach the rail before its next transition, then circuit functionality may be incorrect. Slow transitions can lead to higher power consumption as the transistor passes through the transition and can cause excessively high crowbar current, which has EM implication inside a cell (not checked at chip level) as well as delay and power estimate accuracy issues. Ramptime, also commonly referred to as slew, of signals must be within characterization range and meet maximum library characterization limits, otherwise delay prediction accuracy can be compromised.

If ramptime violations are found, corrections are made before proceeding in the design process. Current industrial EDA tools, like the IC Compiler (ICC) and PrimeTime® from Synopsys® of Mountain View, Calif., typically have limits in the library based on characterization limits that are fairly relaxed. Users typically set a global constant ramptime limit (CRL) to a more realistic constraint. A place-and-route tool and a timing signoff tool are examples of EDA tools that can employ a global CRL.

Employing the CRL during implementation and signoff can have multiple disadvantages including: making timing closure more difficult and time consuming, creating more of cross-talk strong aggressors, and creating more signal-EM violations. Additionally, using a CRL can penalize a slow clock domain with ramptime limits that are too aggressive for the data signals and clock signals (over-design), can make a need to waive every slow clock domain with ramptime violation or correcting false violations, can insert extra buffers to avoid false ramptime violations and can prompt the use of net length limits (like 400 nm, 500 nm) that may over-constrain strong drivers and have no impact on constraining weak drivers. Thus, while a CRL can provide a strict and sufficient limit, the CRL can be too conservative.

SUMMARY

One aspect provides a method of generating flexible ramptime limits for an electronic circuit. In one embodiment, the method includes: (1) calculating a frequency based ramptime limit for each data signal and clock signal of the electronic circuit, (2) obtaining a library based ramptime limit for each data signal and clock signal of the electronic circuit, (3) determining a minimum ramptime limit between the frequency based ramptime limit and the library based ramptime limit for each data signal and clock signal and (4) selecting the minimum ramptime limit as the flexible ramptime limit for each data signal and clock signal.

Another aspect provides an apparatus. In one embodiment, the apparatus includes: (1) a ramptime limit generator configured to calculate a frequency based ramptime limit and obtain a library based ramptime limit for a net of an electronic circuit and (2) a flexible ramptime limit selector configured to determine a minimum ramptime limit between the frequency based ramptime limit and the library based ramptime limit and select the minimum ramptime limit as a flexible ramptime limit for the net.

In yet another aspect a method of manufacturing an electronic circuit is provided. In one embodiment, the method includes: (1) physically synthesizing a logical representation of an electronic circuit employing flexible ramptime limits, (2) performing a timing test on the physically synthesized electronic circuit employing the flexible ramptime limits and (3) determining if there is a violation of the flexible ramptime limits.

In yet a different aspect, a computer program product is provided. In one embodiment, the computer program product performs a method that includes: (1) calculating a frequency based ramptime limit for each data signal and clock signal of the electronic circuit, (2) obtaining a library based ramptime limit for each data signal and clock signal of the electronic circuit, (3) determining a minimum ramptime limit between the frequency based ramptime limit and the library based ramptime limit for each data signal and clock signal and (4) selecting the minimum ramptime limit as the flexible ramptime limit for each data signal and clock signal.

BRIEF DESCRIPTION

Reference is now made to the following descriptions taken in conjunction with the accompanying drawings, in which.

DETAILED DESCRIPTION

Disclosed herein are flexible ramptime limits that are a function of a clock domain of an electronic circuit for which flexible ramptime limits are generated and maximum ramptime used during library characterization. The disclosed flexible ramptime limits, which can be calculated automatically by a timing tool, can provide a ramptime limit that is not unnecessarily conservative. Implementation and timing signoff tools may employ the flexible ramptime limits to improve design metrics. The flexible ramptime limits may be employed in other stages of the design process such as RTL synthesis, Netlist generation and Netlist optimization.

Unlike conventional CRL that are used for testing, the disclosed flexible ramptime limits allow a different ramptime limit for different data signals. Additionally, employing flexible ramptime limits allow for different ramptime limits for different clock signals. Furthermore, flexible ramptime limits are calculated instead of being provided as an input value. Various EDA tools, such as a placement and routing tool and a timing signoff tool may automatically calculate and employ the flexible ramptime limits. Thus, a flexible ramptime limit can be automatically calculated for each unique data signal and clock signal of an electronic circuit.

Figure 1:
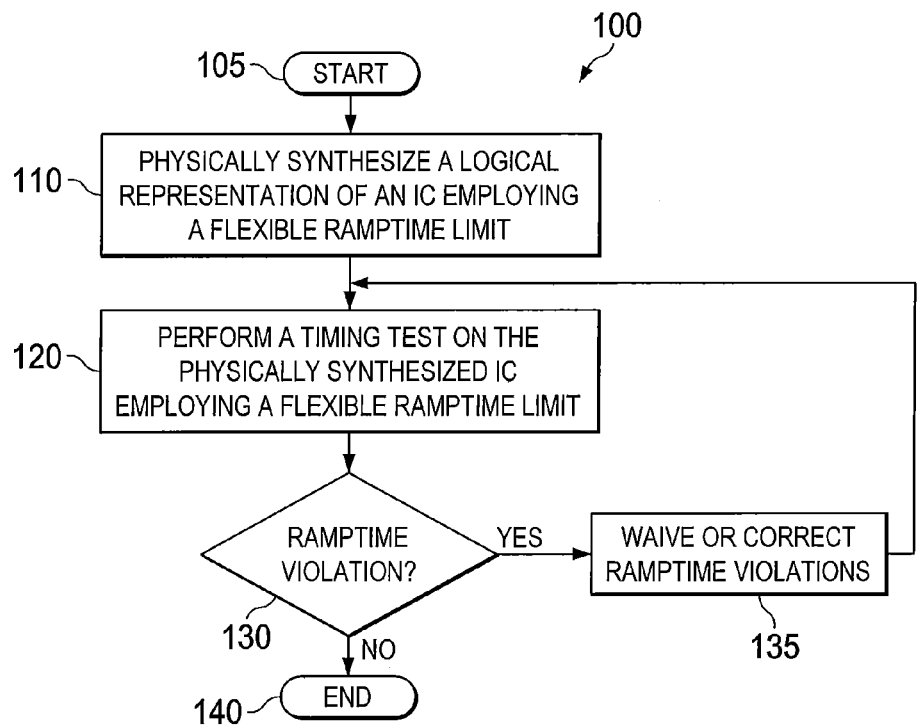
FIG. 1 is a flow diagram of one embodiment of a method of determining if there is a ramptime limit violation for an electronic circuit as carried out according to the principles of the disclosure.

FIG. 1 is a flow diagram of one embodiment of a method 100 of determining if there is a ramptime limit violation for an electronic circuit as carried out according to the principles of the disclosure. A portion of the method 100 may be performed by an EDA tool. In some embodiments, multiple EDA tools may be used to perform the method 100. The electronic circuit may be an integrated circuit. The method 100 begins in a step 105.

In a step 110, a logical representation of the electronic circuit is physically synthesized employing a flexible ramptime limit. Typically referred to as the implementation stage, physical synthesis includes placement and routing stages. The electronic circuit may be represented as a netlist. Logic gates or cells from a library are selected to represent the netlist and are employed to implement the physical design of the electronic circuit. In a placement stage, the gates are assigned to locations of a die area. Various nets of the electronic circuit are then established when the placed gates are then wired together in a routing stage.

Ramptimes of data signals and clock signals are considered during the placement and routing stages to meet signal integrity requirements. Unlike conventional design processes, the method 100 employs a flexible ramptime limit for the placement and routing stages to insure compliance with the signal integrity requirements. In one embodiment, an EDA tool is used to determine the flexible ramptime limit for each data net and each clock domain (i.e., clock net) of the electronic circuit. The specific flexible ramptime limit that is determined for each data net and each clock net is used for placing the cells and connecting the cells. In the electronic circuit, a data signal traverses a data net and a clock signal traverses a clock net.

In step 110, a flexible ramptime limit is employed to insure compliance with signal integrity requirements. Thus, instead of constraining all of the gates and connections to the same ramptime limit during the implementation stage, a different ramptime limit can be used for the various data nets and clock nets of the electronic circuit. As such, routing between the various gates for communicating data signals and clock signals may not be unnecessarily constrained.

Figure 2:
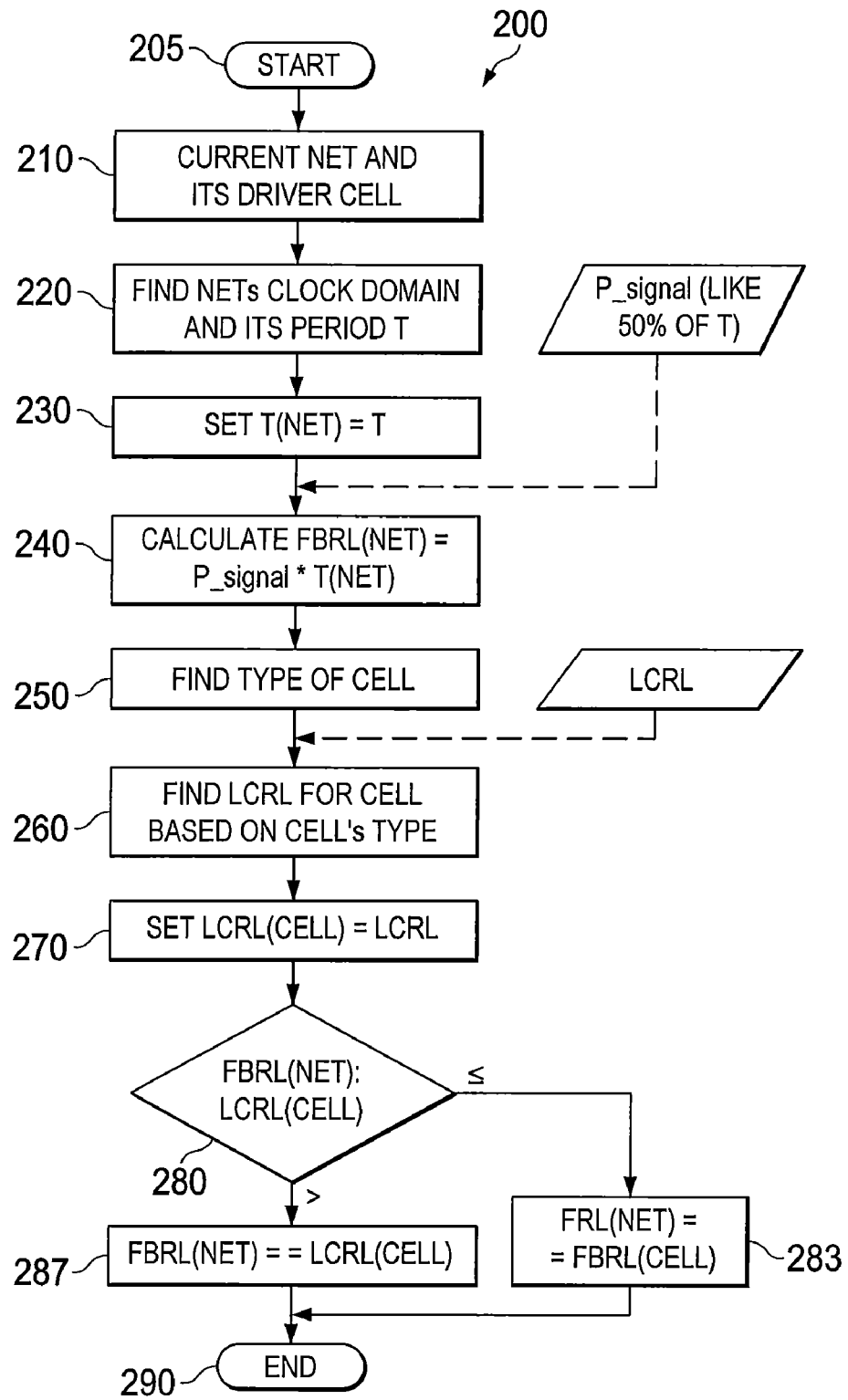
FIG. 2 is a flow diagram of one embodiment of a method of determining a flexible ramptime limit for a data signal of an electronic circuit carried out according to the principles of the disclosure.
Figure 3:
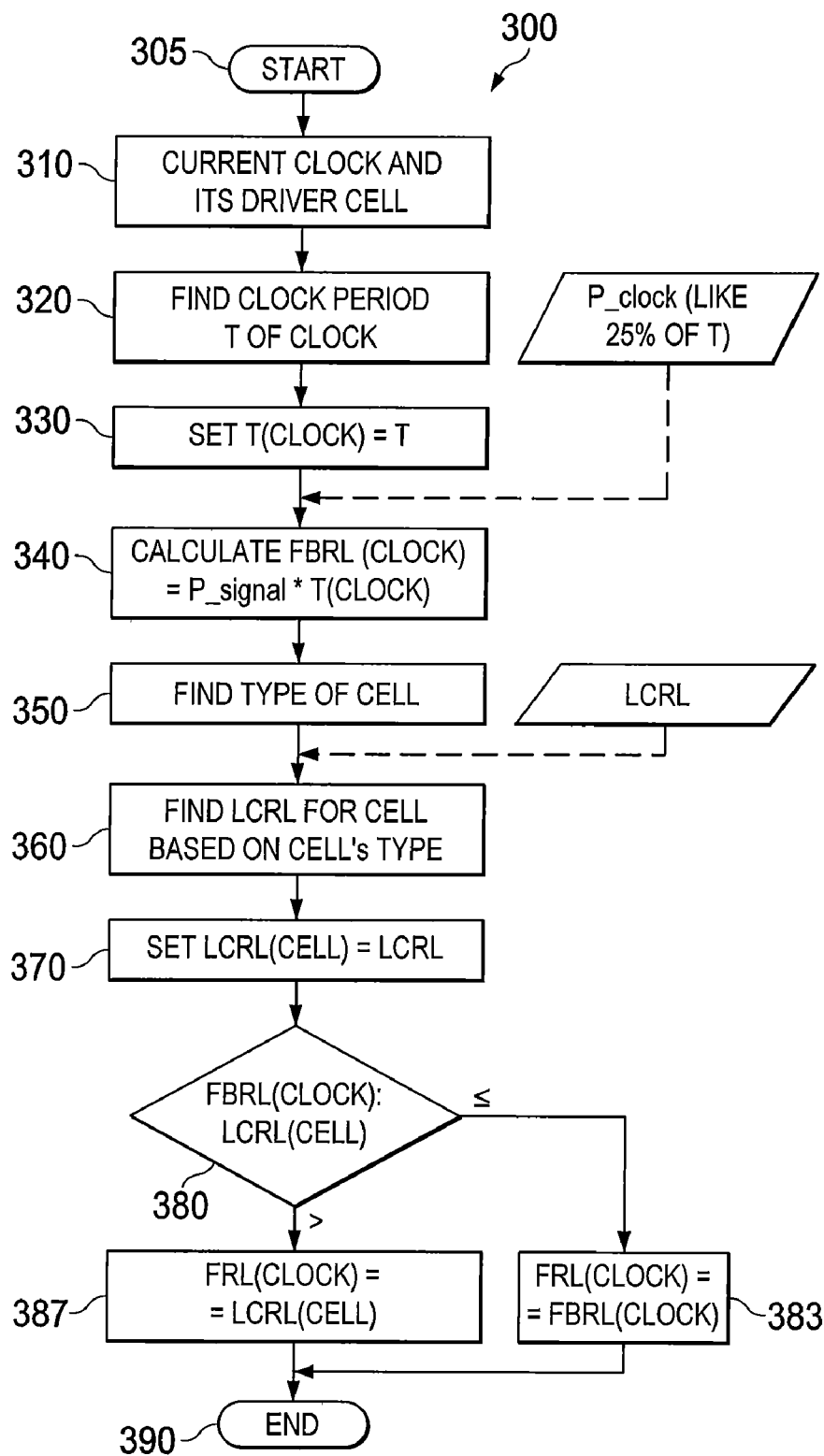
FIG. 3 is a flow diagram of one embodiment of a method of determining a flexible ramptime limit for a clock signal of an electronic circuit carried out according to the principles of the disclosure.

An EDA tool or tools may be used for the implementation stage. As such, an EDA tool may automatically determine flexible ramptime limits for the placement and routing stages. The EDA tool may determine the flexible ramptime limits as a function of the clock domain of the applicable net and the maximum ramptime ranges used during library characterization. The EDA tool may determine the flexible ramptime limits as illustrated in FIG. 2 or 3 depending on if the current net being implemented is a data net or a clock net.

A timing test of the physically synthesized integrated circuit is then conducted in a step 120 employing a flexible ramptime limit. The timing test is performed to insure the signal integrity requirements of the physically synthesized integrated circuit are met. The timing test may be a timing signoff test that is typically employed in a conventional design process for an electronic circuit. An EDA tool may be used to perform the timing signoff. The timing test EDA tool may automatically determine the flexible ramptime limit for performing the timing test on the IC. In some embodiments, the EDA tool that performs the timing test may be different than the EDA tool or tools that perform the placing and routing. In some embodiments, the various EDA tools used for testing may share the flexible ramptime limits therebetween for the various stages of the design process. For example, a first EDA tool may determine the flexible ramptime limits for placing or routing and send the flexible ramptime limits to a second EDA tool that employs the already determined flexible ramptime limits for a timing test. As in the placement and routing stages, the timing EDA tool may determine the flexible ramptime limits as a function of the clock domain of the current net and the maximum ramptime ranges used during library characterization. The EDA tool used for the timing test may automatically determine the flexible ramptime limits as illustrated in FIG. 2 or 3 depending on if the current net is a data net or a clock net.

In a decisional step 130, a determination is made if there were any ramptime limit violations detected. The determination is based on the results of the timing test. The EDA tool used for the timing test may generate a report that indicates the clock signal or data signal, and therefore the associated clock nets or data nets, has a ramptime violation. If there are no ramptime violations detected, the method 100 continues to step 140 and ends. At this point, the design process can continue for manufacturing the electronic circuit.

If a ramptime limit violation is detected, the method 100 continues to step 135 where each ramptime violation is either waived or corrected. After step 135, the method 100 continues to step 120 where timing test are again performed. As such, the corrections are tested for compliance. The method 100 then continues as described above.

FIG. 2 is a flow diagram of one embodiment of a method 200 of determining a flexible ramptime limit for a data signal of an electronic circuit carried out according to the principles of the disclosure. The method 200 may be carried out by an EDA tool. For example, a placement and routing EDA tool may perform the method 200. Additionally, an EDA timing tool may perform the method 200. Other EDA tools may also employ the method of 200 for various stages of the design process. The method 200 is carried out for each data net of the electronic circuit. In one embodiment, all of the data nets in the same clock domain will have the same flexible ramptime limit. For those data nets in different clock domains, the flexible ramptime limits may be different. The method 200 starts in a step 205 wherein at least some of the steps may be performed automatically.

In a step 210, a first or current data net of the electronic circuit and a driver cell of the data net are identified. The current data net is the data net of the electronic circuit that is presently active, presently being implemented or tested. The EDA tool may identify the current data net and the corresponding driver cell.

The clock domain for the data net and the period (T) of the clock domain are determined in a step 220. In one embodiment, the clock domain for the data net is the clock domain of the logical gates coupled together by the data net. The clock domain for the data net may be obtained from a timing tool used in the design of the electronic circuit. The period or clock period will be specified with the clock domain that is obtained.

The period for the data net is then set to the period of the clock domain in a step 230. An EDA tool may automatically perform this step.

In a step 240, a frequency based ramptime limit (FBRL) for the data net (FBRL(NET)) is calculated. The FBRL is a clock-based ramptime limit. The FBRL may be defined as a percentage of the period of the data net. For example, the FBRL may be defined as 50% of the period of the data net. The 50% limit may be used for margin because of the tail effect in a signal transition. With the 50% limit, a data signal is allowed to have its transition during the first 50% of the cycle, while the other 50% will be used by the signal settling. In some embodiments, some relaxation of the 50% limit is possible. For example, a 60% limit may be used.

The FBRL(NET) may be calculated according to Equation that is based on ramptimes measured for rail-to-rail transition or 0%-100% (or 100%-0%) of voltage supply:

$$FBRL(NET)=T(NET)/2 \text{(for signal in NET)}. \quad \text{(Equation 1)}$$

In case of other ways of ramptime measurement, Equation 1 may be modified accordingly. For example if ramptimes are measured at 30%-50% (or 50%-30%) of voltage supply, then Equation 2 may be used to calculate the FBRL(NET):

$$FBRL(NET)=T(NET)/10 \text{(for signal in NET)}. \quad \text{(Equation 2)}$$

The type of the driver cell for the current data net is then determined in a step 250. The type of the driver cell may be obtained from a cell library that is being used for the implementation stage of the electronic circuit. The type of a cell refers to the kind of cell (e.g., a gate such as an OR, AND, etc.) and the information associated with the cell. The information can include the number of inputs and driving strength of the cell since there may be several of the same kind of cells with different strength but the same function and input number. The associated information may also include the voltage threshold (like low VT, standard VT, high VT). Thus, each cell in a particular design is a detailed and specific library type.

The Library Characterization Ramptime Limit (LCRL) for the type of driver cell is then determined in a step 260. The LCRL may be obtained from the library having the driver cell. In some embodiments, the LCRL may be stored in a memory associated with the EDA tool performing the method 200. For example, the LCRL may be stored in a table that includes the LCRL for various cell types. The LCRL may be provided as an input to the method 200. In one embodiment, the LCRL is automatically obtained from the cell library.

Employing only FBRL when determining the flexible ramptime limits may not be sufficient because contemporary delay models like Composite Current Source (CCS) model instead of Non-Linear Delay Model (NLDM) practically do not allow any extrapolation of ramptime beyond LCRL. LCRL represents the maximum ramptime that is used for delay models during library characterizations. LCRL may be less for current technologies than for older technologies. In the method 200, the LCRL is a function of the type of cell that drives NET. Thus, LCRL=LCRL(CELL).

In a step 270, the LCRL for the driver cell (LCRL(CELL)) is set as the LCRL for the cell type. An EDA tool may automatically perform this step.

In a decision step 280, a determination is made if the FBRL(NET) is less than or equal to the LCRL(CELL). If the FBRL(NET) is less than or equal to the LCRL(CELL), the flexible ramptime limit for the data net (FRL(NET)) is set to the FBRL(NET) in a step 283. The method 200 then continues to step 290 and ends. If this is not the last data net of the electronic circuit, the method 200 is repeated.

If the FBRL(NET) is not less than or equal to the LCRL(CELL), the flexible ramptime limit for the data net FRL(NET) is set to the LCRL(CELL) in a step 287. The method 200 then continues to step 290 and ends. Again, if this is not the last data net of the electronic circuit, the method 200 is repeated. In other words, the method 200 is performed for each data net of the electronic circuit.

FIG. 3 is a flow diagram of one embodiment of a method 300 of determining a flexible ramptime limit for a clock signal of an electronic circuit carried out according to the principles of the disclosure. The method 300 may be carried out by an EDA tool. A placement and routing EDA tool and an EDA timing tool may both perform the method 300. Other EDA tools may also employ the method of 300 for various stages of the design process. The method 300 is carried out for each clock net (i.e., clock domain) of the electronic circuit. The method 300 starts in a step 305 wherein at least some of the steps may be performed automatically.

In a step 310, a first or current clock net of the electronic circuit and a driver cell of the clock net are identified. The current clock net is the clock net of the electronic circuit that is presently being implemented or tested. The EDA tool may identify the current clock net and the corresponding driver cell.

The clock period (T) of the clock net is determined in a step 320. The clock period may be obtained from a timing tool used in the design of the electronic circuit. The clock period (T) may be retrieved for the current clock net from the design description (e.g., in a data base). The period for the clock net is then set to the obtained clock period in a step 330. In one embodiment, the clock period for the clock net, T(CLOCK), is stored in memory in a table. The table may include multiple entries with each entry of the table having a clock period T for clock nets of clock domain CLOCK. If T(CLOCK) already exists in the table for a current clock net, step 320 does not need to be performed. In other words, the clock period (T) of the clock net has already been determined.

In a step 340, a frequency based ramptime limit (FBRL) for the clock net (FBRL(CLOCK)) is calculated. The FBRL(CLOCK) may be defined as a percentage of the clock period. For example, the FBRL(CLOCK) may be defined as 25% of the period of the clock. The FBRL(CLOCK) may be calculated according to Equation 3 that is based on ramptimes measured for rail-to-rail transition or 0%-100% (or 100%-0%) of voltage supply:

$$FBRL(CLOCK)=T(CLOCK)/4 \text{(for clock)}. \quad \text{(Equation 3)}$$

In case of other ways of ramptime measurement, Equation 3 may be modified accordingly. For example if ramptimes are measured at 30%-50% (or 50%-30%) of voltage supply, then Equation 4 may be used to calculate the FBRL(CLOCK):

$$FBRL(CLOCK)=T(CLOCK)/20 \text{(for clock)}. \quad \text{(Equation 4)}$$

The type of the driver cell for the clock net is then determined in a step 350. The type of the driver cell may be obtained from a cell library that is being used for implementation stage of the electronic circuit.

The Library Characterization Ramptime Limit (LCRL) for the type of the driver cell is then determined in a step 360. The LCRL for the driver cell of the clock net may be determined as the LCRL for the driver cell of the clock net.

In a step 370, the LCRL for the driver cell (LCRL(CELL)) is set as the LCRL for the cell type. An EDA tool may automatically perform this step.

In a decision step 380, a determination is made if the FBRL(CLOCK) is less than or equal to the LCRL(CELL). If the FBRL(CLOCK) is less than or equal to the LCRL(CELL), the flexible ramptime limit for the clock net (FRL(CLOCK)) is set to the FBRL(CLOCK) in a step 383. The method 300 then continues to step 390 and ends. If this is not the last clock net of the electronic circuit, the method 300 is repeated.

If the FBRL(CLOCK) is not less than or equal to the LCRL(CELL), the flexible ramptime limit for the clock net FRL(CLOCK) is set to the LCRL(CELL) in a step 387. The method 300 then continues to step 390 and ends. Again, if this is not the last clock net of the electronic circuit, the method 200 is repeated. In other words, the method 300 is performed for each clock net of the electronic circuit.

Figure 4:
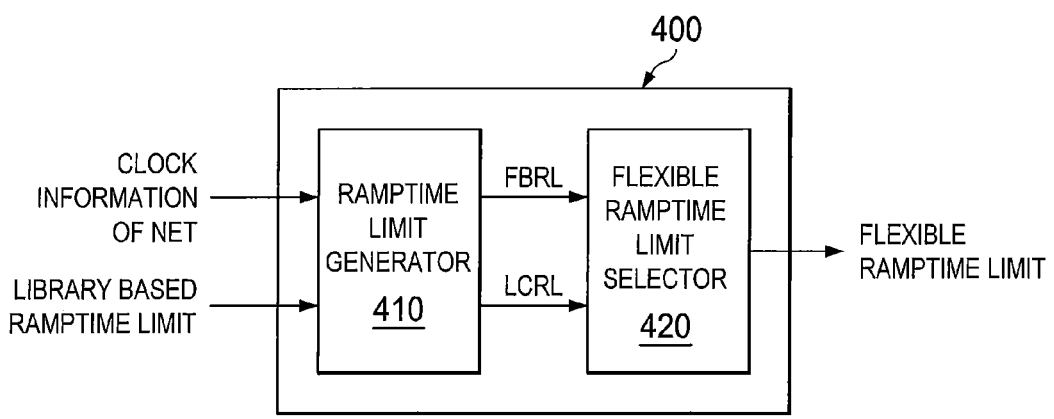
FIG. 4 is a block diagram of one embodiment of an apparatus that employs a flexible ramptime limit and is constructed according to the principles of the disclosure.

FIG. 4 is a block diagram of one embodiment of an apparatus 400 constructed according to the principles of the disclosure. The apparatus 400 may be implemented as a dedicated hardware device having logic circuitry configured to perform the functions described herein. In some embodiments, the apparatus 400 may be a combination of hardware and software. The apparatus 400 may be an EDA tool or may be implemented by multiple EDA tools. In one embodiment, the apparatus 400 may embodied as a series of operating instructions stored on computer-readable medium, wherein the operating instructions direct the operation of a processor when initiated thereby. The apparatus 400, therefore, may be implemented as a general computing device having a processor and a memory. The apparatus 400 includes a ramptime limit generator 410 and a flexible ramptime limit selector 420.

The ramptime limit generator 410 is configured to calculate a frequency based ramptime limit and obtain a library based ramptime limit for a net of an electronic circuit. The net may be a data net or a clock net. The net of the electronic circuit has a cell driver of a certain type. The library based ramptime limit is a LCRL for the particular cell type of the cell driver. The ramptime limit generator 410 may automatically obtain the LCRL from the cell library of the cell driver. The ramptime limit generator 410 may also automatically calculate the frequency based ramptime limit. The frequency based ramptime limit may be a function of a clock period for a signal that traverses the net in the electronic circuit. The ramptime limit generator 410 may calculate a frequency based ramptime limit as discussed with respect to FIG. 2 or 3.

The flexible ramptime limit selector 420 is configured to determine a minimum ramptime limit between the frequency based ramptime limit and the library based ramptime limit and select the minimum ramptime limit as a flexible ramptime limit for the net. As noted above, the net may be a data net or a clock net of the electronic circuit. The electronic circuit typically includes multiple data nets and multiple clock nets. As such, the apparatus 400 selects a flexible ramptime limit for each of the data nets and for each of the clock nets. The flexible ramptime limit selector 420 may select a flexible ramptime limit as discussed with respect to FIG. 2 or 3.

Certain embodiments disclosed herein relate to computer storage products with a computer-readable medium that have program code thereon for performing various computer-implemented operations that embody the tools or carry out the steps of the methods set forth herein, such as illustrated in FIGS. 1-3. The media and program code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A method of generating flexible ramptime limits for an electronic circuit, comprising:
    calculating a frequency based ramptime limit for each data signal and clock signal of said electronic circuit;
    obtaining a library based ramptime limit for each said data signal and said clock signal of said electronic circuit;
    determining a minimum ramptime limit between said frequency based ramptime limit and said library based ramptime limit for each said data signal and said clock signal; and
    selecting said minimum ramptime limit, using a processor, as said flexible ramptime limit for each said data signal and said clock signal.

2. The method as recited in claim 1 wherein each said data signal traverses a data net of said electronic circuit.

3. The method as recited in claim 2 wherein each said clock signal traverses a clock net of said electronic circuit.

4. The method as recited in claim 3 wherein said electronic circuit includes multiple data nets and multiple clock nets.

5. The method as recited in claim 1 wherein said library based ramptime limit is a Library Characterization Ramptime Limit for a type of cell that is associated with a data net or a clock net of said electronic circuit.

6. The method as recited in claim 1 wherein said frequency based ramptime limit is a function of a period for a data signal or a clock signal of said electronic circuit.

7. The method as recited in claim 1 wherein said calculating, said determining and said selecting are performed automatically.

8. An apparatus, comprising:
    a ramptime limit generator configured to calculate a frequency based ramptime limit and obtain a library based ramptime limit for a net of an electronic circuit;
    a flexible ramptime limit selector configured to determine a minimum ramptime limit between said frequency based ramptime limit and said library based ramptime limit and select said minimum ramptime limit as a flexible ramptime limit for said net.

9. The apparatus as recited in claim 8 wherein said net is a data net.

10. The apparatus as recited in claim 8 wherein said net is a clock net.

11. The apparatus as recited in claim 8 wherein said net has a cell driver and said library based ramptime limit is a Library Characterization Ramptime Limit for a type of said cell driver.

12. The apparatus as recited in claim 8 wherein said frequency based ramptime limit is a function of a clock period for a signal that traverses said net.

13. The apparatus as recited in claim 8 wherein said ramptime limit generator is configured to automatically calculate said frequency based ramptime limit and automatically obtain said library based ramptime limit.

14. The apparatus as recited in claim 8 wherein said flexible ramptime limit selector is configured to automatically determine a minimum ramptime limit between said frequency based ramptime limit and said library based ramptime limit and automatically select said minimum ramptime limit as a flexible ramptime limit for said net.

15. The apparatus as recited in claim 8 wherein said apparatus is an Electronic Design Automation tool.

16. A computer program product, comprising a non-transitory computer readable medium having a series of operating instructions embodied therein, said series of operating instructions adapted to be executed to implement a method of generating flexible ramptime limits, comprising:

calculating a frequency based ramptime limit for each data signal and clock signal of said electronic circuit;

obtaining a library based ramptime limit for each said data signal and said clock signal of said electronic circuit;

determining a minimum ramptime limit between said frequency based ramptime limit and said library based ramptime limit for each said data signal and said clock signal; and selecting said minimum ramptime limit as said flexible ramptime limit for each said data signal and said clock signal.

* * * * *